(12) United States Patent
Kliman et al.

(10) Patent No.: US 6,262,550 B1
(45) Date of Patent: Jul. 17, 2001

(54) ELECTRICAL MOTOR MONITORING SYSTEM AND METHOD

(75) Inventors: Gerald B. Kliman; Rudolph A. Koegl; John R. Krahn, all of Niskayuna; William J. Premerlani, Scotia, all of NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/465,935

(22) Filed: Dec. 17, 1999

(51) Int. Cl.[7] .................................................. G05B 23/02
(52) U.S. Cl. ............................................ 318/565; 388/909
(58) Field of Search ................................ 318/565; 388/909

(56) References Cited

U.S. PATENT DOCUMENTS

| | | | |
|---|---|---|---|
| 5,680,025 | 10/1997 | Bowers, III et al. | 318/806 |
| 5,726,911 | 3/1998 | Canada et al. | 364/550 |
| 5,739,698 | 4/1998 | Bowers et al. | 324/772 |
| 5,852,351 | 12/1998 | Canada et al. | 318/490 |
| 5,917,428 | * 1/1999 | Discenzo et al. | 340/870.01 |
| 6,077,051 | * 1/2000 | Centers et al. | 417/280 |
| 6,124,692 | * 9/2000 | Canada et al. | 318/490 |
| 6,144,924 | 11/2000 | Dowling et al. | 702/60 |

OTHER PUBLICATIONS

*Report Summary*, "Remote Equipment Diagnostics: Infrastructure Description," Eprigen, Jan. 15, 2000 (2 pages).
"An Integrated Distributed Motor Monitoring System", Prasad et al, Proceedings of IEEE TENCON 1998, pp. 575–579.

* cited by examiner

*Primary Examiner*—Robert E. Nappi
*Assistant Examiner*—Rita Leykin
(74) *Attorney, Agent, or Firm*—Nixon & Vanderhye P.C.

(57) ABSTRACT

An integrated motor monitoring system collects, analyzes, and stores to database(s) on-line and off-line coordinated real-time motor data for industrial AC and DC motors. On-line coordinated real-time motor data from both on-motor sensors and remote sensors at a motor control center are collected simultaneously and processed. Off-line measurements are performed with integrated stimulus and measurement apparatus. Monitoring units at the motor and motor control center each collect specific data on the motor. The database provides current and historical data on the motor for analyses conducted at the motor or at the motor control center. Additionally the motor monitoring system has the capability of relating motor system or process events with motor performance.

18 Claims, 10 Drawing Sheets

"On-Line" Motor Side

"AC On-Line" MCC Side

"DC On-Line" MCC Side

"Off-Line"

ELECTRICAL MOTOR MONITORING SYSTEM AND METHOD

BACKGROUND OF THE INVENTION

The present invention relates to the monitoring and diagnosis of electrical motors, especially motors monitored by sensors located both at the motor and remotely at a circuit breaker or other remote motor control unit.

In one embodiment, the invention is a novel motor "fingerprinting" system that monitors and simultaneously tracks several dynamic and static motor conditions on site at the motor and from a remote motor control center. The data on the static and dynamic motor conditions is synchronized and stored in databases maintained at the motor, the motor control center and/or a central and/or local location. The invention may further include a novel method for determining the torque output of a motor based on the data collected from the motor.

Industrial electrical motors are in widespread use in manufacturing, power generation and other industrial facilities. These motors must be monitored and maintained to ensure their proper operation. There are a wide variety of motor parameters that can be monitored to provide service personnel with information regarding the condition of a motor. These parameters include dynamic operating conditions, such as vibration, speed, temperature, and stray magnetic flux that are measured by sensors on or adjacent the motor. Other dynamic motor parameters, such as voltage and current, are best monitored at remote stations, such as at transformers and circuit breakers where those parameters can be safely monitored by avoiding the high voltage and current levels that may exist directly at the motor. In addition, static motor conditions, such as current leakage through insulation, are measured when the motor is off-line, e.g., disconnected from its power supply.

In the past, static and dynamic motor parameters have not been monitored by an integrated sensor and instrumentation system. Similarly, the data on motor condition has not been collected simultaneously in real-time to allow for review of motor condition data, or to allow for storage of data on various motor parameters in a comprehensive database. Instead of having a synchronized collection of the current and historical data on the condition of a motor, service personnel have had to rely on many independent test instruments and databases to obtain static and dynamic motor data. These independent tests do not collect data synchronously and do not allow service personnel to synchronize data from various test instruments. In addition, the coordinated analysis of certain system events, i.e. contact closures, in conjunction with motor parameters has been difficult if not impossible to achieve. Thus, service personnel are not able to compare the timing of certain test results, such as current and voltage inputs of a motor, with the timing of other test results, such as vibration, stray magnetic flux and motor temperature or system events (i.e., contact closures, valve functions, etc). Other disadvantages of using independent instruments include the inconvenience to service personnel and that service personnel do not have ready access to complete and coordinated motor data when diagnosing motor problems. The motor service personnel have a long-felt need for access to aggregate collections of data on a motor to allow them to better detect when motors require servicing, repairs, or replacement, as well as to assess the suitability of a motor for a certain function or location.

Prior motor test equipment provided limited functional test capability. These prior test instruments were usually individual instruments that addressed a specific motor characteristic or condition. The instruments were also often limited to use with a certain class of motors, such as low voltage, medium voltage, alternating current (AC) induction, AC synchronous, direct current (DC) and other motor classes. A service person had to operate and interpret many different motor test instruments to service motors of different classes. He had to be trained and be knowledgeable of all of the instrument types. The service person also had to have access to each of these instruments, and know where the instruments were positioned with respect to the motor in order to gather the motor data from the instruments.

BRIEF SUMMARY OF THE INVENTION

There is a long-felt need to synchronously collect motor data from the various sensors and test instruments that monitor a motor on-site and remotely at a motor control center (MCC).

Briefly, according to one embodiment, a motor monitoring systemcomprises: an on-site motor instrument unit having an on-site motor sensor (including at least one sensing device) for monitoring a motor, wherein the on-site sensor generates a signal representative of a first motor condition; an on-site motor computer unitelectronically connectable to the on-site motor measurement unit, and processing the signal representative of the first motor condition; an off-site motor control center having a remote sensor (including at least one sensing device) for remotely monitoring a second motor condition, wherein the remote sensor generates a signal representative of a second motor condition; an off-site motor control center computer unit electronically connectable to the off-site motor control center and processing the signals representative of the second motor condition, and a communications link between the on-site motor computer unit and the off-site computer.

Data on the dynamic and static operating conditions of a motor provide much information as to whether and when the motor requires maintenance. Motor service companies employ a technique of condition based monitoring (CBM) to maintain industrial motors. Presently, CBM is done with a number of independent dynamic and static measurements to predict when and what motor maintenance is needed. Exemplary, inputs of motor data include current, voltage, leakage current, leakage flux, temperature, vibration, shaft position, speed, RF activity and other characteristics some of which are measured while the motor is operating (hereinafter referred to collectively as dynamic tests). Other tests are measured when the motor is disconnected from its power source, and include static tests such as insulation leakage, megger, and symmetry.

Capturing static and synchronized dynamic motor data from on-site and remote locations and storage of this data in a comprehensive database provides time correlated "fingerprint" of the motor, the load on the motor, and the motor's operation. In addition, displaying historical operational data of a motor would show to maintenance personnel the trends in operating parameters that would help predict motor operation and greatly enhance plant service maintenance.

A novel motor monitoring system has been developed to create an integrated "fingerprint" of a motor. A motor "fingerprint" is a collection of magnitudes, signatures, waveforms, system responses, parameters, text etc. in a database describing the conditional state of a motor. The motor fingerprint incorporates the available motor data necessary to characterize the condition of the motor and the process it is driving.

The Motor Monitoring System captures static (off-line) motor parameters, and dynamic motor parameters at the motor site and at a motor control center. The motor control center is usually remote from the motor, and may be located at, for example, a circuit breaker cabinet or a step-down transformer powering the motor. The motor monitoring system also correlates process events with dynamic motor data to provide a "real-time" window into the motor's dynamic load(s) and their operating status. A complete collection of synchronized motor data may be stored in a comprehensive database maintained locally at the Motor Unit associated with the motor, remotely at the MCC Unit associated with the motor control center, at a satellite database location or at a central database location.

The Motor Monitoring System is an integrated system that acquires time-coordinated data on available motor parameters for processing and storage to a database. Monitoring units at the motor and motor control center each collect specific data on the motor. The data is collected and combined into one database so that the motor site and motor control center each have access to a complete database of all of the current and historical motor data. The system is able to address a broad spectrum of motor classes (such as AC, DC, low and medium voltages) and has universal application to motors at industrial facilities. A further feature of the motor monitoring system is its ability to capture motor information that is relevant to the load on the motor. For example, the captured motor waveform data may be applied to determine the dynamic load torque of the motor. A further feature of the motor monitoring system is its ability to capture motor information that is relevant to process and system events, for example the opening of a valve or closing of a contact.

DETAILED DESCRIPTION OF THE INVENTION

Figure 1:
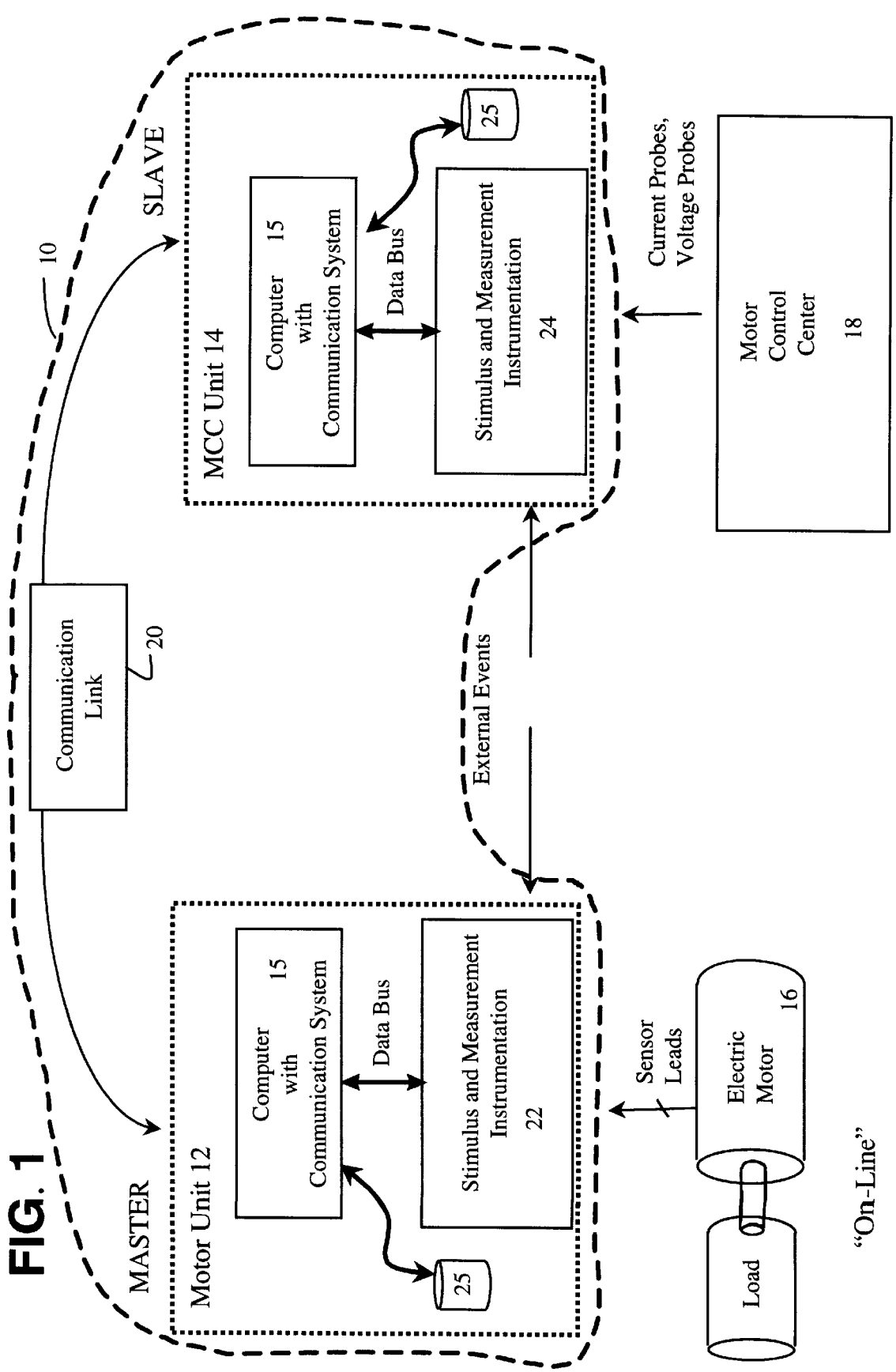
FIG. 1 is a schematic diagram of an embodiment of the invention including Motor Unit 12 and MCC Unit 14 monitoring systems.

FIG. 1 shows a Motor Monitoring System 10 composed of two similar units 12, 14. One Motor Unit 12 is located at the site of the Motor 16. The MCC Unit 14 is located remotely from the Motor 16 at a Motor Control (MC) 19 or Motor Control Center (MCC) 18, such as a circuit breaker cabinet, transformer or other location where the Motor 16 is controlled and certain motor parameters may be safely measured. Although for purposes of explanation one motor unit 12 and one MCC unit 14 are shown, the use of one or more motor units 12 in conjunction with one or more MCC units 14 is within the scope of the invention. Thus, "motor unit" is meant to include "at least one motor unit" and MCC unit is meant to include "at least one MCC unit."

The MCC 18/ MC 19 may be a few yards from the Motor 16, a quarter mile from the Motor 16, or some other arbitrary distance from the Motor 16. The Motor Unit 12 at the Motor 16 may be the "master" unit, and provides a master signal that allows both units to collect data in synchronism.

The MCC Unit 14 at the MCC 18 may be a "slave" unit that is, at least partially, controlled by the master unit 12. Specifically, the slave unit 14 may synchronize its internal timing signals used to collect motor data with a master timing signal from the master unit 12. The synchronization of the MCC units 14 and MC unit 12 may be done on a substantially continuous basis, e.g., every five microseconds, or on a periodic basis, e.g., every, minute, hour or day.

The synchronization of timing signals allows for motor data collected simultaneously by both the MCC Unit 14 and Motor Unit 12 to be synchronized in time. For example, once synchronized the motor data collected at the motor site and the motor data collected remotely at the MCC 18/MC 19 may be compared to determine whether one motor parameter, such as vibration, is controlled by or controls another motor parameter, such as current in one or more of the armature windings.

Synchronization of motor data enables motor technicians and engineers to better diagnosis motor problems and to evaluate motor performance. Cause and effect relationships between two or more motor conditions may become apparent by viewing synchronized motor data. Such a synchronized data comparison may reveal that the cause of a particular motor problem is another motor condition that occurs just before the motor problem occurs. If the motor data were not synchronized, then it would be more difficult to compare two motor conditions to see whether one condition is the cause of another. This feature of synchronization of motor data, especially data obtained by different and remote systems, was not available in prior motor monitoring systems.

Figure 6:
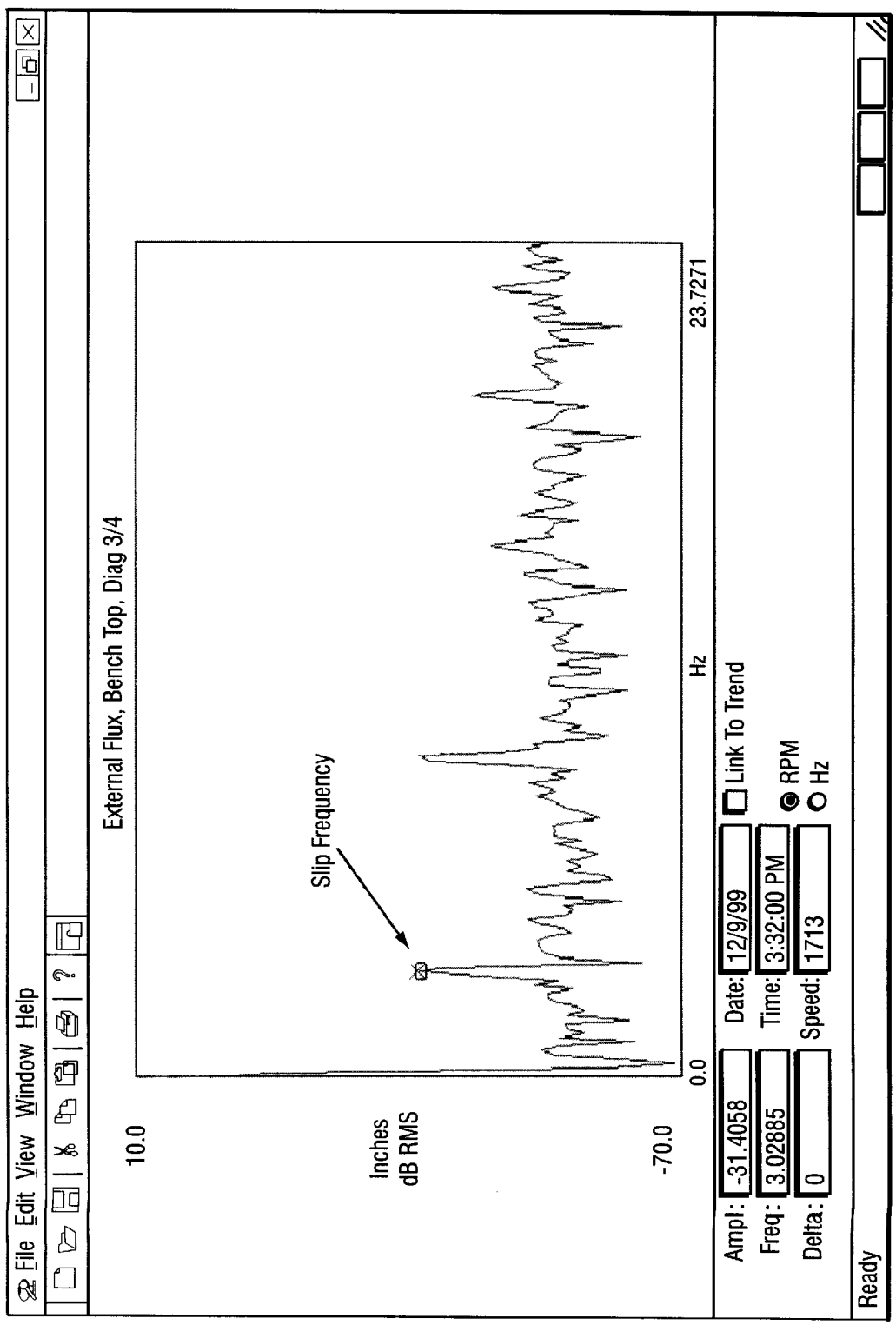
FIG. 6 is an exemplary chart showing the slip frequency (flux spectra) motor parameter collected at the motor.
Figure 7:
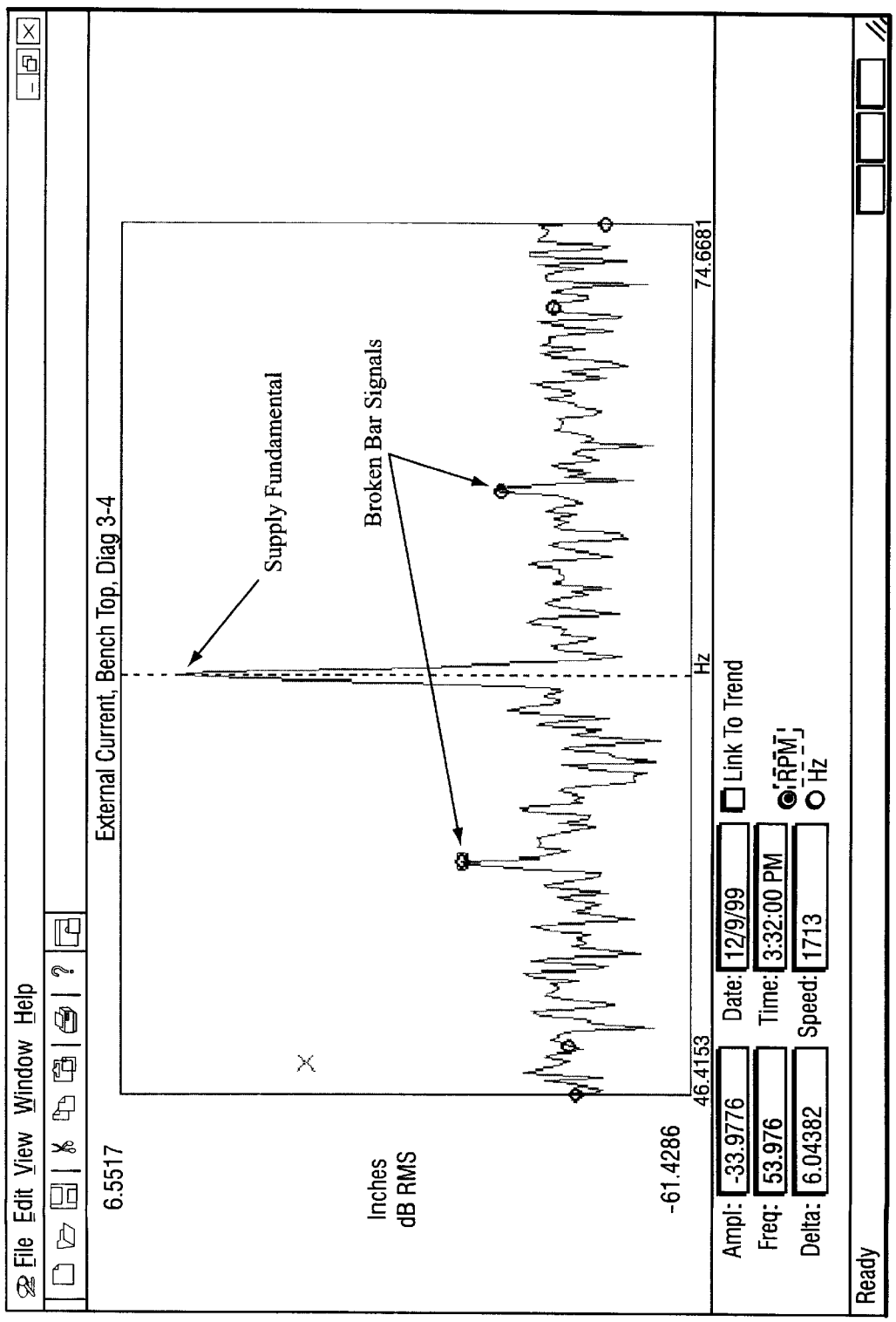
FIG. 7 is an exemplary chart showing the broken bar signals (current spectra in the 60 Hz region) motor parameter collected at the Motor Control Center 18.
Figure 8:
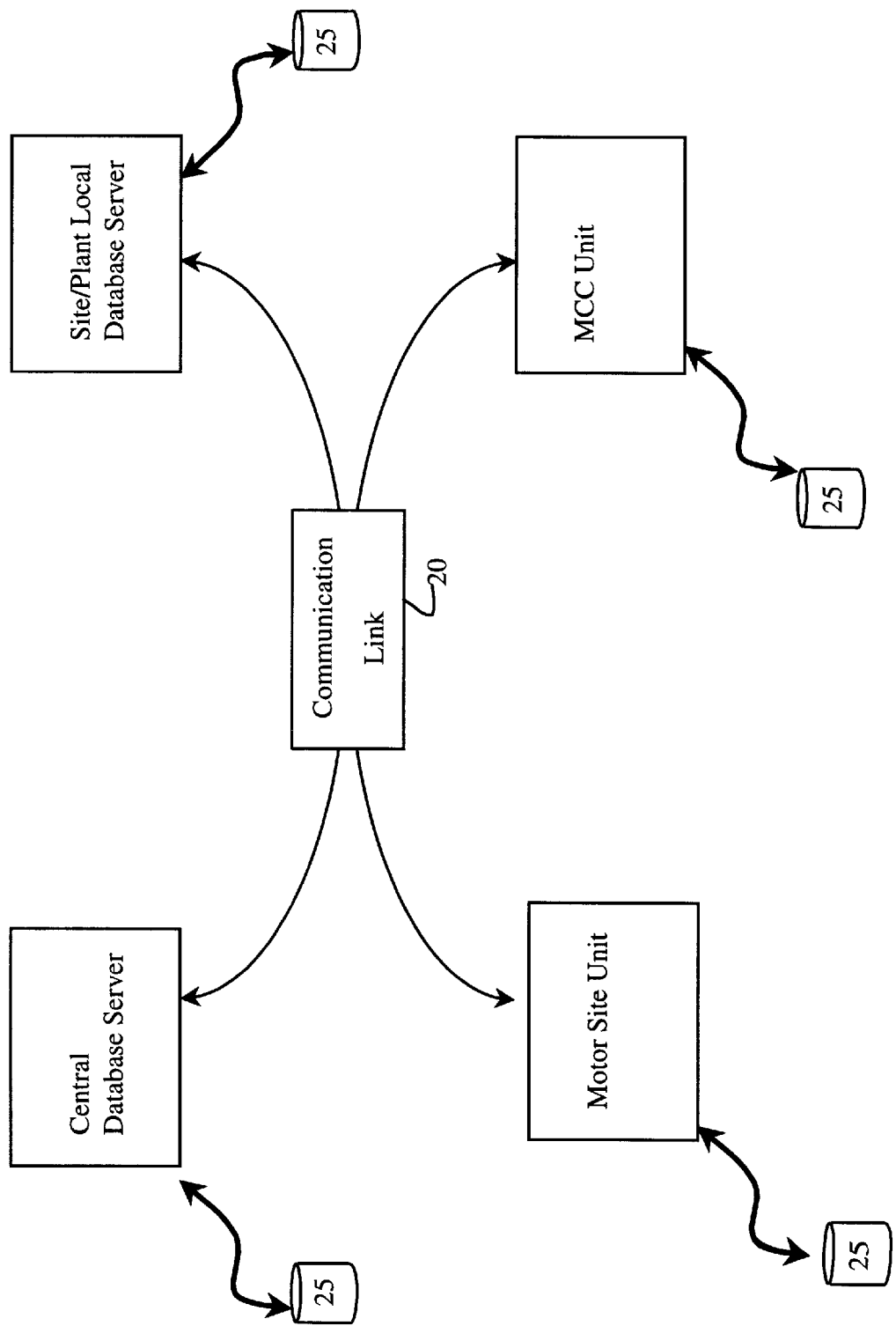
FIG. 8 is a simplified diagram of the database locations.

For example, data on one motor condition, e.g., current load, can be best compared to another motor condition, e.g., magnetic flux emissions, if all of the data is synchronized. An example of the advantages of time synchronization is shown in FIGS. 6 and 7. FIG. 6 shows the spectrum of the external flux of an induction motor acquired at the Motor 16 by Motor Unit 12. The identified peaks in this spectrum are due to currents and normal asymmetries in the rotor. It has been shown that the principal harmonic in this spectrum, 3.03 Hz, is the frequency of the rotor currents or the "slip frequency". At the same time as the external flux data was acquired at the Motor Unit 12 the motor current data was acquired at the MCC Unit 14 and its spectrum is shown in FIG. 7. The identified sidebands in FIG. 7 have been shown to be a result of cracked or broken bars in the rotor and should be displaced from the fundamental, exactly 60.02 Hz in this case, by exactly twice the slip frequency. Thus, a "broken bar" spectrum line should appear at exactly 53.96 Hz. In FIG. 7 it is identified as 53.98 Hz which is well within the precision of the measurements. Since the slip frequency is a function of rotor temperature and load it will drift, making identification of the sidebands difficult without time coordination. In the case shown here there is not much ambiguity since the test rotor was severely damaged and the motor was running in a dynamometer at fixed load. However, in the field other peaks do occur in the vicinity of the broken bar peaks making it difficult to identify the correct one. Moreover, when the rotor is only slightly damaged the correct peak will be little higher than the adjacent background further complicating the problem if a simultaneous slip frequency measurement is not available and may result in identifying the wrong signal. Use of the Motor Unit 12 Tachometer 38 for this identification of the MCC Unit 14 current spectrum is an alternate procedure for identification of the slip frequency.

The master/slave roles of the Motor Unit 12 and MCC Unit 14 may be reversed. The pair of monitoring units 12, 14 are connected by a Communication Link 20, which may be a high-speed bus that is a hard-wired Ethernet network or a wireless path, such as a radio or optical local-area-network (LAN). The Communication Link 20 is used to simultaneously exchange motor data between the Motor Unit 12 and the MCC unit 14, to synchronize the timing operations between the two units, to access a common motor database (or, alternatively, to update and correlate multiple motor databases each having the same motor data), and for other communication purposes. The data collected on the motor parameters includes information on the motor condition, motor performance and the timing on which the data was sensed from the motor.

To detect a cause and effect relationship between two or more motor parameters a comparison of synchronized data on these parameters may be performed. The database(s) is updated with synchronized data following data acquisition by the monitoring units 12 and 14. The motor data stored in the database includes synchronized motor data information so that data on one or more dynamic motor conditions may be compared based on its relative timing with respect to other dynamic motor conditions. Synchronizing the computer buses may not always be feasible, in which case the clock settings only may be synchronized using known methods and data taken in approximate time correspondence.

The Motor Unit 12 and the MCC Unit 14, each include conventional computer hardware 15, such as a central processor unit; memory, such as random-access memory (RAM) and read-only memory (ROM); mass storage devices such as a hard-drive disk and CDROM; a communication module, such as a modem or network card; a keyboard, display monitor, and input and output connections over, for example, a data bus. The Motor Unit 12 and MCC Unit 14 perform certain functions by executing programs that are stored in their memories.

The computer functions may include polling the Stimulus and Measurement Instrumentation units 22 and 24 to capture data from the sensors reporting to the stimulus and measurement instrumentation. For example, the Motor Unit 12 and MCC Unit 14 may periodically interrogate the measurement instrumentation 22, 24 respectively to gather data on such motor conditions as temperature, vibration, rotational speed, and other conditions. The frequency at which these conditions are captured by the computer depends on sampling schedules set in the programs executed by the computer. The data is captured simultaneously from the dynamic sensors, e.g., vibration, current, voltage, stray flux and motor temperature. By simultaneously capturing dynamic motor data (regardless of whether the data is obtained from instruments at the motor site or the motor control center) the data may be reviewed to compare how the various dynamic parameters of the motor varies with respect to other dynamic parameters.

Figure 2:
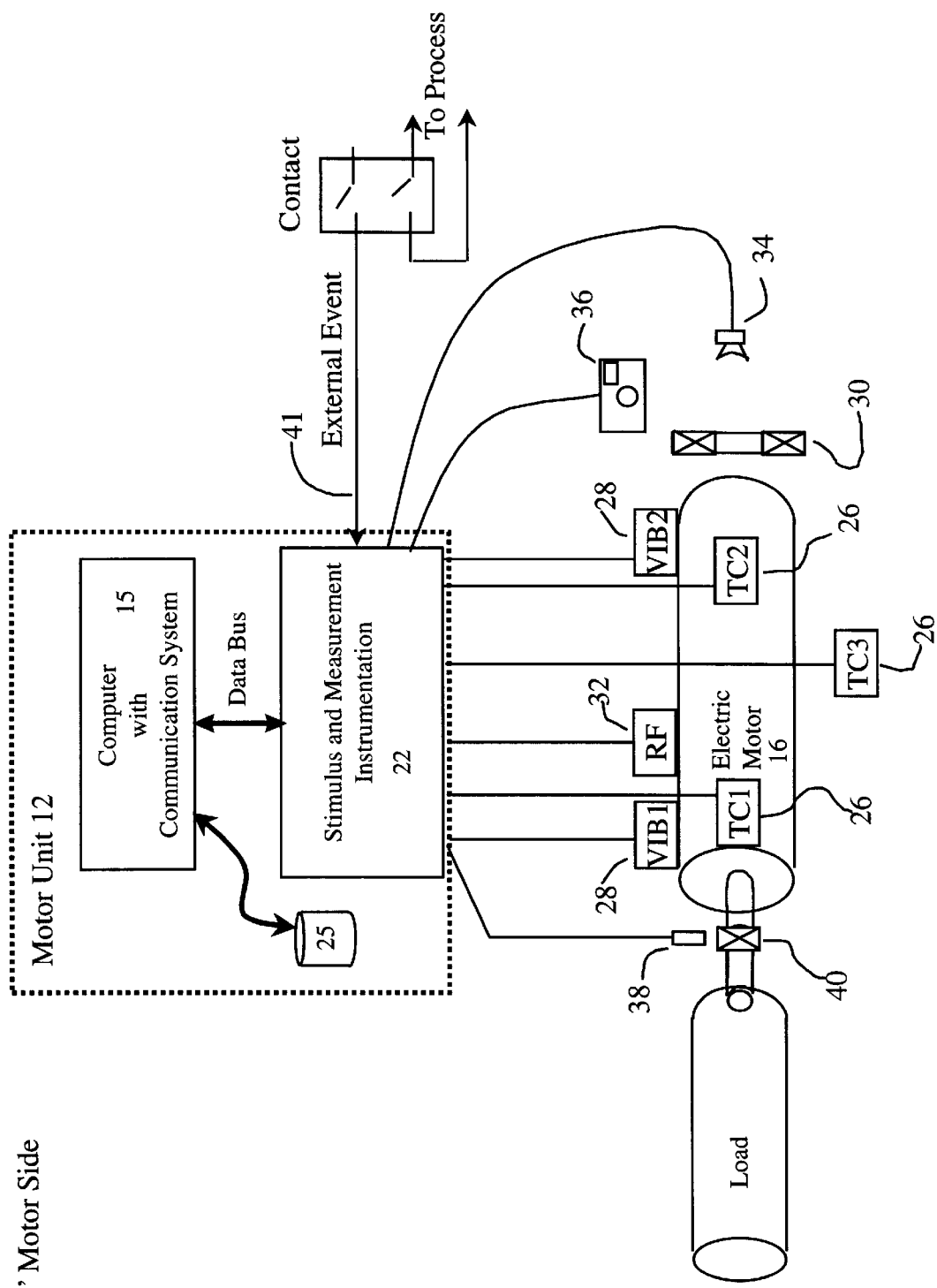
FIG. 2 is a diagram showing the Motor Unit 12 and associated sensors and its relation to a Motor 16.
Figure 3:
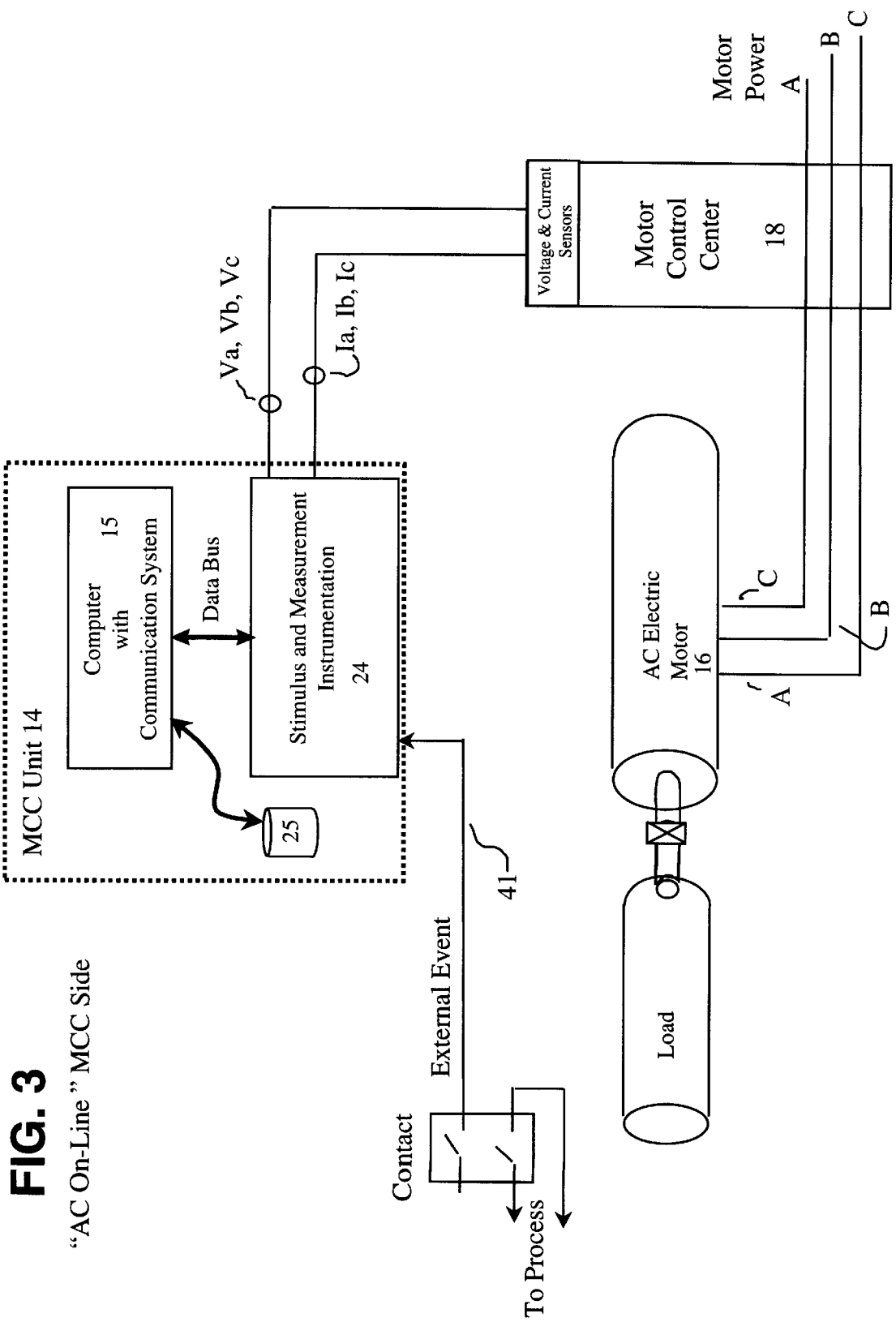
FIG. 3 is a diagram showing the MCC Unit 14 and associated sensors and its relation to a Motor Control Center 18.
Figure 4:
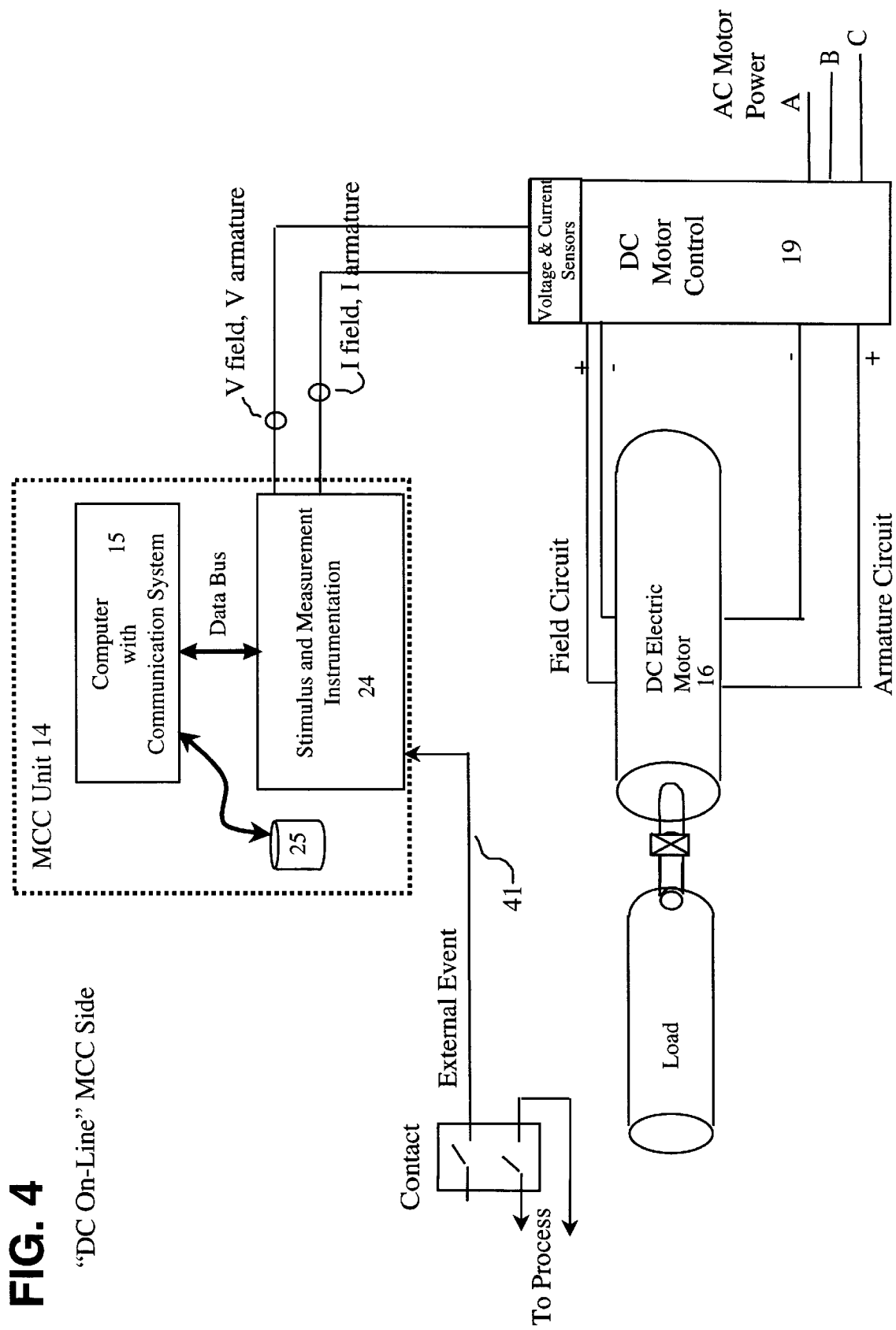
FIG. 4 is a diagram showing the MCC Unit 14 and associated sensors and its relation to a DC Motor Control 19.

The monitoring unit 12 and 14 may generate alarms or warnings when certain sensor signals exceed predefined ranges or when certain motor conditions occur. For example, if the temperature of the motor exceeds a threshold level at which the motor has dangerously overheated. FIG. 2 is a schematic diagram showing an exemplary Motor 16, being monitored by various sensors which are connected to the Stimulus and Measurement unit 22, which in turn reports data extracted from the sensor signals to the computer 15 of the Motor Unit 12. The Motor Unit 12 may include sufficient processing intelligence to determine whether a signal value from one of the sensors is beyond a certain range and display the information to the operator.

The Motor Unit 12 acquires data signals from the Stimulus and Measurement Instrumentation unit 22, which in turn captures signals from the sensors that are in contact with the motor or in the immediate vicinity of the motor. Some examples of these direct motor contact sensors include, but are not limited to:

Temperature—Temperature sensors 26, such as resistance temperature detectors (RTD), thermocouples (TC) or thermistors, are placed on the motor to monitor the operating temperature of, for example, the stator, rotor and cooling fluids (including air). The temperature signals from these sensors are generally slowly varying direct current (DC) signals that can be converted to digital data indicative of temperature. New and historical temperature data is stored in the database and available at the monitoring units.

Vibration—Accelerometers 28 are typical vibration sensors used to obtain data regarding the vibratory state of a motor. An exemplary accelerometer is an integrated circuit, piezoelectric (ICP) accelerometer with built-in FET (field effect transistor). Conventional amplifiers and A/D (analog to digital) converters automatically convert sensor signals to digital acceleration data. These vibration signals may be frequency dependent, and sense motor vibrations from 0 to 30 kHz, for example. New and historical vibration data is stored in the database and available at the monitoring units.

Stray Flux—A stray (external) flux sensor 30 (shown as coaxial, but may be in other positions or orientations) detects the leakage of magnetic flux from the motor. Flux signals provide information on potential motor problem areas, such as broken rotor bars, turn to turn faults, eccentricity, etc., especially where the sensor detects the flux leaking out the motor end bells or through the motor frame. The flux sensor may be a simple coil of fine wire with many turns located near motor end bells and/or the motor frame. New and historical flux data is stored in the database and available at the monitoring units.

RF Activity—A radio frequency (RF) sensor 32 senses RF motor emissions, which are indicative of electrical faults developing in the motor. Substantial RF emissions from a motor or emissions at certain frequencies or emissions producing characteristic patterns when displayed relative to the drive waveform indicate motor insulation deterioration or faults in the motor windings of AC motors. The analysis of RF emissions from a motor is sometimes referred to as "partial discharge analysis". RF motor activity is also associated with commutator quality in DC motors, in that sparking by a DC motor emits RF spikes that are detected by the RF sensor 32. The RF sensor may be an antenna, a resistor, inductor or high frequency current transformer (in series with a suitable blocking capacitor if needed) connected between the motor lines, or from a motor line to ground. New and historical RF data is stored in the database and available at the monitoring units.

Sound—A microphone 34 at or near the motor receives radiated or airborne noise from the motor. A microphone and/or an ultrasonic (typically, but not limited to, 10 kHz to 100 kHz) transducer attached to the motor are suitable sound sensors. The sound sensor may be used to detect certain motor problems, such as a deteriorating motor bearing. The sound data may be saved in the database as sound data files or converted frequency data representative of the sound levels at specific frequencies. The sound data when synchronized with vibration data and current and/or voltage data may reveal problems with a particular winding or mechanical part, e.g., bearing, in the motor. New and historical sound data is stored in the database and available at the monitoring units.

Images—A digital camera 36 provides images of the motor that are entered into the Motor Monitoring System 10 for; overall visual appearance, infra-red for temperature distribution, startup sparking in AC motors, commutator sparking in DC motors or general commutator appearance. The images may be stored as data files in the database for subsequent viewing to diagnose a motor problem, and for comparison with a real-time image of the motor. New and historical image data is stored in the database and available at the monitoring units.

Profilometer—A commutator profile is a static image or graph showing deviations of the surface of a commutator from circular, an important characteristic of DC motors. A commuter profile is stored as a file in the database. Profiling tools (not shown), such as linear motion transducers or proximity detectors provide an image of a commutator surface. A digitized surface image of the commutator is stored in the database. New and historical profile data is stored in the database and available at the monitoring units.

Rotor Position—A laser 38 (or equivalent rotational sensor) senses a mark 40 (or bump) on the motor shaft, as the mark rotates on the shaft. By sensing when the mark passes the laser 38, the revolution speed and phase of rotation of the motor can be determined to generate a once per revolution signal that may be processed into speed or rotor phase synchronization data. Comparing data showing cyclical voltage and/or current spikes with synchronized rotor position data may indicate a faulty winding in the rotor, a defective rotor slot, or other rotor problem. New and historical position data is stored in the database and available at the monitoring units.

Events—Event signals 41 are used to obtain data relating motor system events with motor data for example, the opening/closing of a valve or contact. Event signals can be useful for identification of motor system or process related problems.

The MCC Unit 14 acquires signals from the Stimulus and Measurement Instrumentation unit 24, which in turn captures signals from the sensors that are associated with the motor control center or in the immediate vicinity. These signals typically are too difficult or too unsafe (due to high voltage) to be acquired at the motor. These motor signals include, but are not limited to:

Voltages—For an AC motor system, voltages are usually derived from the 120-volt secondaries of the potential transformers in the MCC. Voltage and current measurements may be taken directly from the motor for systems operating at approximately 480 volts and below. Normally, there will be three line voltage signals collected from the AC motor system. In some instances, there may be two such signals if the AC motor is without neutral (line-to-neutral or line-to-line) connected. For a DC motor system, voltage measurements are taken from the separate terminal feeds (usually at the MCC) for the armature and field windings. AC synchronous motor systems having a DC field, are a cross between the AC and DC systems, and, thus, the voltage measurements that are taken will be a hybrid of the AC and DC motor current and voltage measurements. New and historical voltage data is stored in the database 25 and is available at the monitoring units.

Currents—For an AC motor system, phase/line currents are usually derived from the secondary windings (e.g., 5-ampere secondaries) of the current transformers at the MCC or at the motor for 480 volt systems and lower. Normally, there will be three, but could be four, current signals depending on whether the neutral of an AC motor is connected and monitored. For a DC motor system, there will be separate field and armature current sensors. AC synchronous machines, with a DC field, are a cross between the AC and DC systems. New and historical current data is stored in the database 25 and is available at the monitoring units.

Leakage Current—The MCC may include a ground fault detector, which is a current transformer in which the motor leads pass through the same core window. The output coil will be another input to the MCC Unit 14. A ground fault signal may be reported as an alarm at the motor monitoring units. New and historical leakage current data is stored in the database 25 and is available at the monitoring units.

Events—Event signals 41 are used to obtain data relating motor system events with motor data for example, the opening/closing of a valve or contact. Event signals can be useful for identification of motor system or process related problems.

Figure 5:
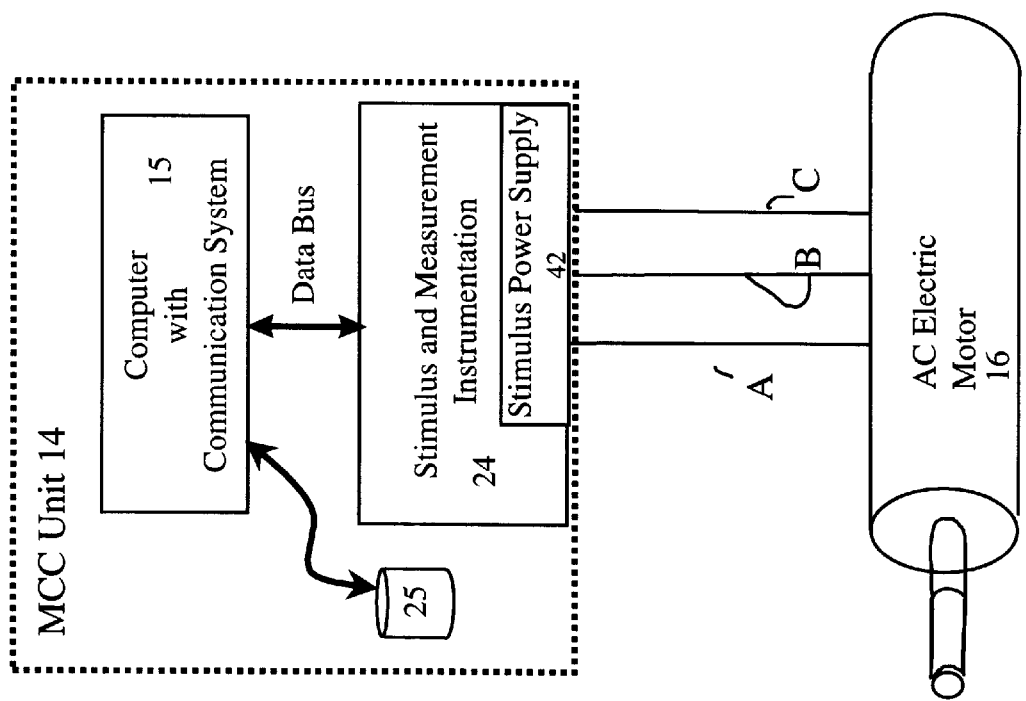
FIG. 5 is a diagram showing the MCC Unit 14 in an off-line testing mode, shown with an AC or DC electric motor.

The integrated Motor Monitoring System 10 may also capture data of several static tests that are performed while the motor is disconnected from its power source, i.e., off-line. During off-line (static) testing, a digitally-controlled Stimulus Power Supply 42 is applied to the motor, as shown in FIG. 5. The following off-line tests and others may be performed at the motor or the motor control centers 19 and 18 including all the intermediate connections and switches:

Megger—The insulation of a motor is tested during a "megger" test. A DC voltage of usually from 500 to 1000 volts is applied between each motor terminal and ground. The resulting current from the terminal 42 to ground is recorded in the database 25. Automatic current limiting is used during the megger tests to avoid consequential damage to the motor winding and to avoid harm to the test instruments. Historical data on the megger tests is stored in the database.

Polarization Index—A DC voltage is applied from each terminal to ground.

A current sensing instrument records the resulting dynamic current as it reaches equilibrium. The time for the dynamic current to reach equilibrium is indicative of motor insulation condition.

Resistance—A DC voltage is applied to the motor terminals sequentially and the resulting current measured. The several measured ratios of voltage to current (i.e. resistance) are compared to each other and to the motor specifications to determine if each phase resistance is within tolerance. In addition, if no current is detected between a pair of terminals, then an open circuit in the armature windings may exist.

Inductance—An AC voltage, at various frequencies, is applied to the motor terminals sequentially. The resulting currents are measured and the inductances calculated from them. DC or AC bias voltages may also be applied at the same time for special purposes. The measured values are compared against each other and to the motor data sheets.

Frequency Response—An AC voltage, with or without DC bias, is applied to the motor terminals. The frequency of the voltage is swept over a wide range and the current measured. The shape and specific resonances (and anti-resonances) of a motor are used to calculate motor parameters for comparison to the motor data sheets. Deviations are fault indicators.

Partial Discharge Activity—An AC voltage sinusoid or DC pulse is applied to the terminals. The electrical discharge activity is measured with the RF sensor. This measurement provides an indication of the health of the motor insulation.

Rotational Symmetry—Excitation AC voltage is applied to the motor terminals at a variety of fixed frequencies. The rotor of the motor is rotated slowly at one excitation frequency and the response recorded. A rotor position sensor may be attached for this measurement. The patterns of the AC current for all three phases may be compared to ensure that the phases are balanced. These patterns may be synchronized with the rotor position data to determine where there are unsymmetrical areas on the rotor.

The energized (dynamic) and unenergized (static) motor data acquired under the control of the Motor Monitoring System 10, are stored in the databases for archival purposes and may be processed to extract certain performance indicators which are then stored and/or transmitted to a local database for further processing and/or trending. In addition, computer facilities may be available for synchronized feature data extraction, storage and electronic transmission to a centralized computer site for further processing, trending, evaluation and archiving.

The Motor Monitoring System 10 allows service personnel to access the motor database 25 to obtain current and historical motor data. The personnel may access the databases from either the Motor Unit 12 or the MCC Unit 14. By accessing the databases, the service personnel may obtain a variety of analyses of the motor and its performance, including without limitation, the following examples of various motor analyses:

A) Charting of the vibration spectrum to show bands of motor vibrations that may indicate particular motor faults;

B) Analyze the motor current waveform or spectrum (amps/frequency) to detect broken rotor bars or other faults in motors, such as eccentricity;

C) Analyze motor voltages and currents to determine balance/symmetry, compare phases and to calculate their symmetrical components and/or spectra. FIG. 7 shows a chart of motor currents acquired at the MCC by MCC Unit 14. FIG. 6 shows a chart of motor stray flux acquired at the motor by Motor Unit 12. The measured slip frequency within the flux spectra of FIG. 6 is used to identify the cracked rotor bar frequencies within the current spectra of FIG. 7. These FIGS. illustrates how synchronizing data collected at the motor site (leakage flux or speed) with data collected remotely (current) can reveal problems in the motor, such as cracked rotor bars especially when the speed is varying.

D) Analyze motor currents and voltages as a function of the rotor rotational phase or to isolate negative sequence currents to detect turn-to-turn faults in the windings;

E) Perform on-line measurement of efficiency, power factor, or input power;

F) Calculate electromagnetic torque and estimate of output torque, in the manner described below, to evaluate motor performance and diagnose load problems;

G) Evaluate motor temperature and vibration distributions with graphic display of the motor rotor and/or stator;

H) Evaluate eccentricity by coordinated analysis of motor current and vibration. The analysis may also be done as a function of rotor phase or position;

I) Evaluate leakage current through the insulation of the motor. Leakage current may be charted chronologically as a function of successive static motor inspections;

J) Evaluate motor parameters by model fitting and by frequency response;

K) Evaluate DC motor commutation quality by current spectrum analysis;

L) Evaluate insulation condition based on analyses of off-line (static) tests and RF signatures from dynamic motor operation;

M) Evaluate insulation condition by analysis of ultrasonic vibration and noise; and N) Evaluate symmetry via off-line tests that apply stimuli to the motor.

O) Identify/evaluate the effects of external system events on motor performance, P) Analyze the motor voltage waveform or spectrum (volts/frequency) to detect faults in motors.

In addition to providing information about the operational state of the motor, the collected motor data contains information about the load on the motor. For example, in the database 25 the torque profile or waveform of a motor may provide an indication as to whether the pump it is driving is cavitating. The electromagnetic torque profile, for a good motor and pump would show a steady motor torque. But, when the pump starts cavitating, the torque profile will show torque variations. Thus, the motor torque data may be used to detect pump cavitation. Accordingly, the Motor Monitoring System 10 and its database 25 of motor data provide information on the load on the motor. In another example, motor data from an electric motor driven auger or fan can be correlated with the auger or fan torque profile.

Figure 9:
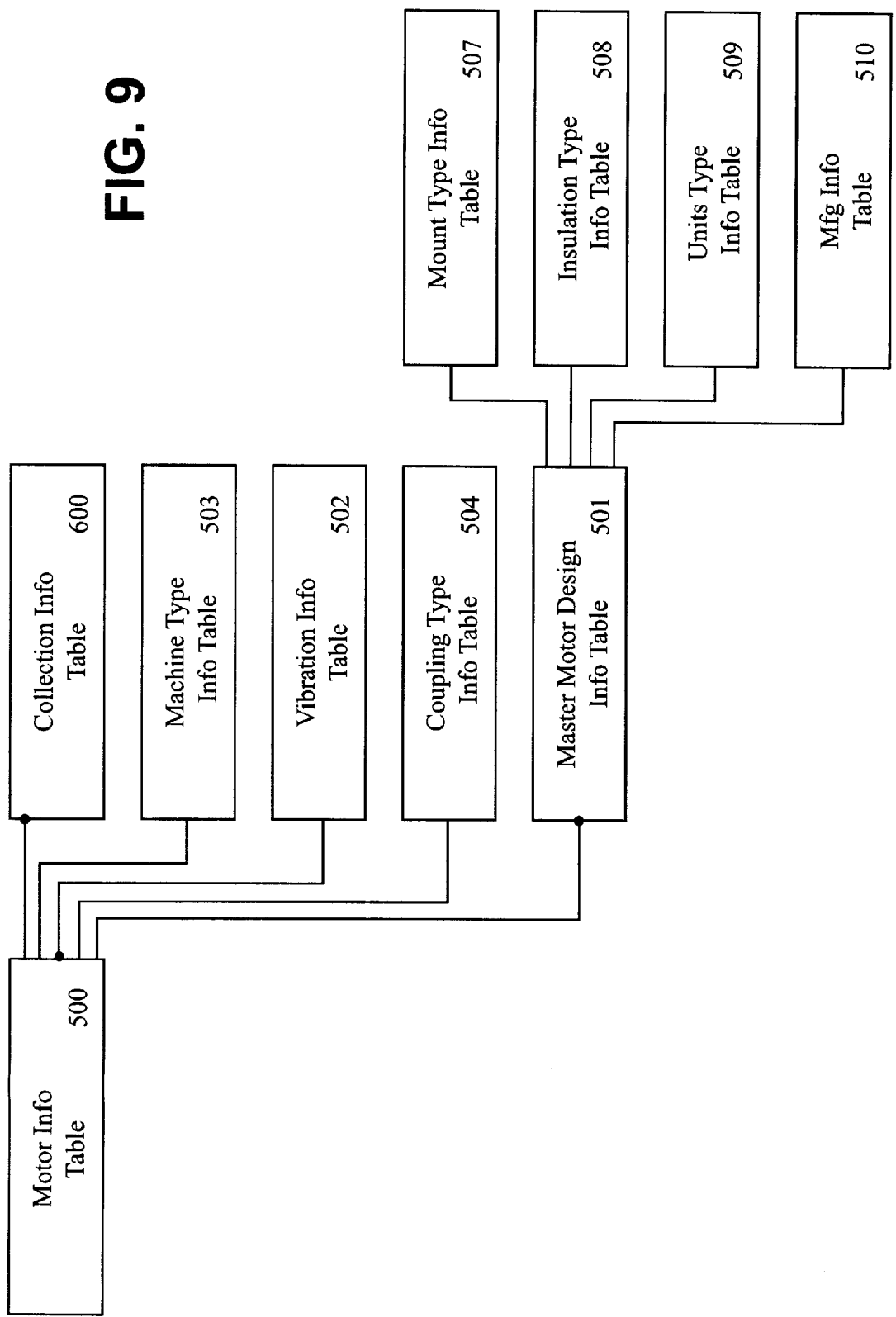
FIG. 9 is an exemplary diagram of the database organization of the motor information portion of the database.
Figure 10:
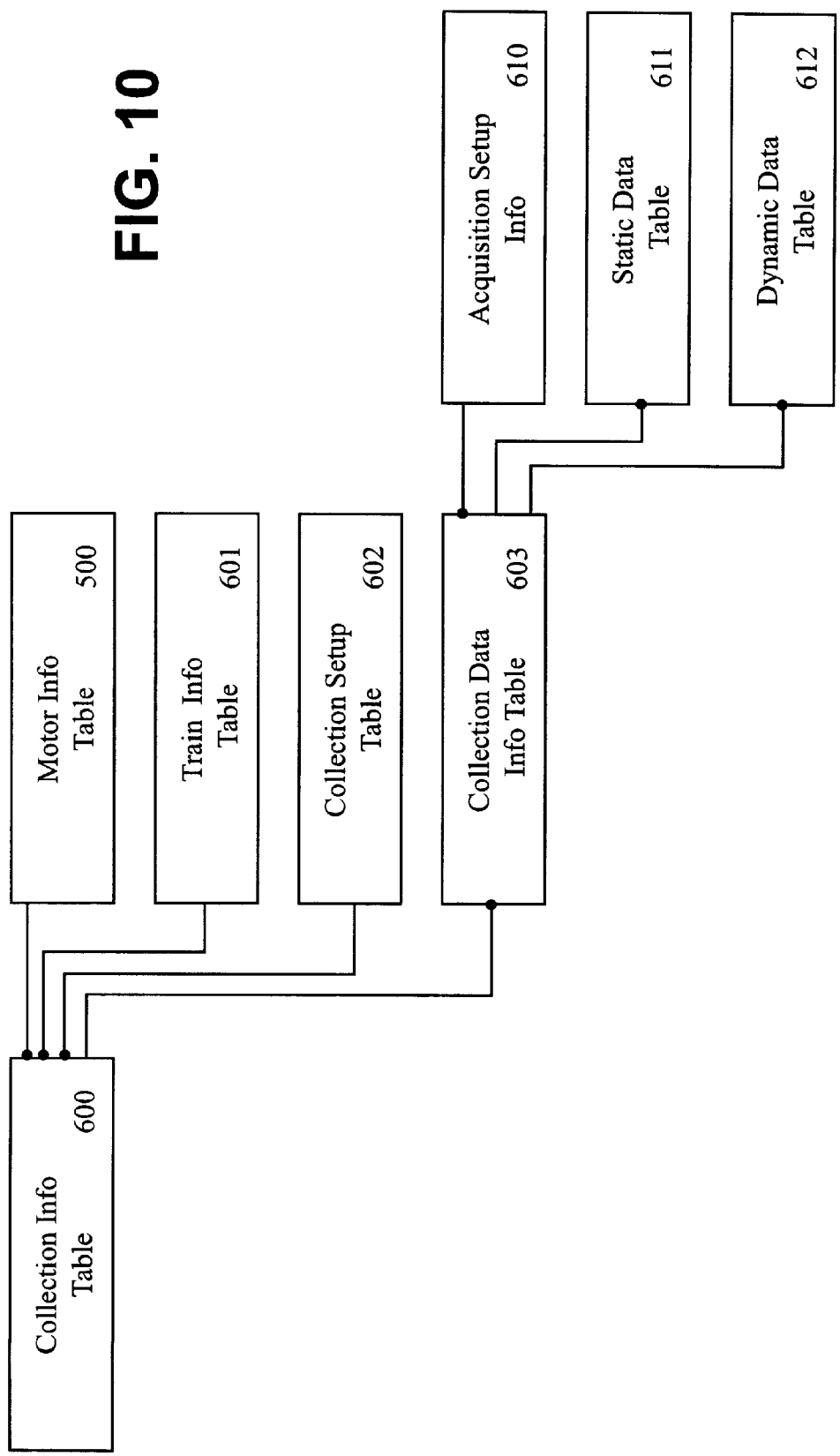
FIG. 10 is an exemplary diagram of the database organization of the data collection portion of the database.

FIG. 9 and FIG. 10 describe a structure for the database. Boxes denote tables and lines denote associations between tables. FIG. 9 depicts the portion of the database with motor information. FIG. 10 depicts the portion of the database with data collection information. Two of the tables in the database, CollectioninfoTable 600 and MotorInfoTable 500 appear in both figures for clarity.

Each motor that is monitored has an entry in the MotorInfoTable 500 shown in FIG. 9, with information about the motor. Each motor entry has an associated entry in the MasterMotorDesignInfoTable 501, which contains information about the motor design, VibrationInfoTable 502, which contains information about the expected vibration levels for the application of that motor, MachineTypeInfoTable 503 with information about the type of machine that the motor is coupled to, and CouplingTypeInfoTable 504, which describes the type of coupling used to couple the motor to the machine that it drives. Further information about the motor design is contained in associated tables MountTypeInfoTable 507, which describes the motor mount, InsulationTypeInfoTable 508, which describes the insulation used in the motor design, UnitsTypeInfoTable 509, which defines the units of various values in the MasterMotorDesignInfoTable 503, and the MfgInfoTable 510, with information about the manufacturer. There is an entry in the CollectionInfoTable 600 for each collection of data taken, with a link to an entry in the MotorInfoTable 500 for the motor being monitored.

Collection data is stored in the tables depicted in FIG. 10. For clarity, the association between the CollectionInfoTable 600 and the MotorInfoTable 500 is repeated. Information about the drive train associated with a collection is stored in the TrainInfoTable 601. Setup information for a series of collections is stored in the CollectionSetupTable 602. The information about the data collected from a given channel has an entry in the CollectionDataInfoTable 603, and is linked to the corresponding entry in the CollectionInfoTable 500. Each entry in the CollectionDataInfoTable 603 is linked to the corresponding entry in the AcquisitionSetupInfo 610 that contains information about the devices used for data acquisition. Acquisition channels are arranged in groups in the hardware. Finally, the actual data is stored in either the StaticDataTable 611 if it expected to change slowly, or the DynamicDataTable 612, if it is a waveform snapshot of a signal with a transient nature.

A torque monitoring system may be implemented within the above-described Motor Monitoring System 10. In addition, implementation within electric motor drive systems or electric motor control systems is also possible. In previous implementations of sensorless torque measurement, both the current and the voltage are converted to digital form by sampling at a relatively-high frequency. The voltage was then numerically integrated to produce the flux linkages needed to combine with the current in the d-q reference frame (d is the direct axis and q is the quadrature axis) torque expression to produce the torque waveform. The numerical integration required considerable computer resources, takes time (which could be a problem in time cycle limited motor monitoring systems or protection relays), and provides limited response due to the measures required to stabilize the integrator such as forgetting factors or lag filters. In addition, these limitations will adversely impact the accuracy of the torque calculation.

A novel torque calculation can be made utilizing the phasors representing the current and voltage of the motor output. The voltages and currents are acquired from the sampled data stored in the database 25. The best approximation to a fundamental phasor is extracted by discrete Fourier transform (DFT) or similar means very quickly for each voltage and current. The acquisition time may be a two full cycles at worst, but may also be a fraction of a cycle. Using the current and voltage phasors, the torque calculation can proceed algebraically in terms of the phasors.

In fixed frequency (e.g., 60 Hz) motors the transient response (starting period, for example) torque pulsations or low frequency fluctuations are needed to perform incipient fault detection in the motor or in the load, e.g., pump cavitation.

Since the voltage excitation is nearly a pure sine wave, nearly all of the information needed for torque calculations is carried by the current data. Little information is lost (but much efficiency is gained) by extracting the best fit of the voltage fundamental phasor calculation, which may then be analytically integrated to produce the flux linkage phasor. The flux linkage phasor is used to produce a time function that is combined with the current waveform to yield the time varying torque. Moreover, this calculation is done without numerical integration and, thus, is accomplished without the substantial processing resources used with prior torque calculations.

In particular, instantaneous torque is computed by multiplying several factors times the "cross" product of flux and current. The equation (1) takes the following form:

$$\text{Torque}(t) = \text{Factors} \cdot (i_d(t) \cdot \Psi_q(t) - i_q(t) \cdot \Psi_d(t)) \quad (1)$$

Torque(t)=instantaneous torque of the motor output.

Factors=a constant determined for each motor or class of motors.

$i_d(t)$=direct axis current $i_q(t)$=quadrature axis current $\Psi_d(t)$=direct axis flux linkage $\Psi_q(t)$=quadrature axis flux linkage t=time The torque equation relates instantaneous torque (torque in equation 1) to instantaneous direct and quadrature axis flux linkage and current. While the measurement or computation of instantaneous motor current is straightforward, it is more difficult to measure or calculate instantaneous magnetic flux linkages for the motor. One approach is to compute instantaneous flux as the time integral of voltage, but is problematic because of the numerical stability of integrators.

Integration can be avoided if an average torque, rather than instantaneous torque, is needed. Average torque can be computed fairly simply from phasors, as follows in equation (2) in a well-known manner:

$$<\text{Torque}> = \text{Factors} \cdot \text{Real}(I_d \cdot \Psi_q^* - I_q \cdot \Psi_d^*) \quad (2)$$

<Torque>=average torque $I_d$=direct axis current phasor $I_q$=quadrature axis current phasor $\Psi_d^*$=complex conjugate of the direct axis flux linkage phasor $\Psi_q^*$=complex conjugate of the quadrature axis flux linkage phasor For balanced, steady-state sinusoidal currents and fluxes, the equation (2) for average torque provides the same answer as the instantaneous torque equation (1). During transients, unbalanced conditions, or non-sinusoidal voltages or currents, there are torque variations that this average equation ignores.

Flux linkage phasors can be computed from voltage phasors using equations (3) and (4):

$$\Psi_d = \frac{V_d}{j \cdot \omega} \quad (3)$$

$$\Psi_q = \frac{V_q}{j \cdot \omega} \quad (4)$$

$V_d$=direct axis voltage phasor $V_q$=quadrature axis voltage phasor

ω=fundamental frequency in radians/sec j=square root of (−1)

Methods for computing current and voltage phasors are well known and commercially available. Current and/or voltage measurement instruments will monitor the current and/or voltage driving a motor and generate data representative of the voltage phasors for use in equations (3) and (4). In many cases the excitation voltages are almost pure sinusoids. In that case, phasors can be used to estimate instantaneous flux linkage for the equation that yields instantaneous torque. First, obtain voltage phasors as shown above. Then compute instantaneous flux from the phasors as follows in equations (5) and (6):

$$\Psi_d = \text{Real}\left(\frac{V_d}{j \cdot \omega} \cdot e^{j \omega t}\right) \quad (5)$$

$$\Psi_q = \text{Real}\left(\frac{V_q}{j \cdot \omega} \cdot e^{j \omega t}\right) \quad (6)$$

These instantaneous flux linkage estimates may then be used with instantaneous currents in the equations (1) and (2) to compute instantaneous torque. Provided that voltages are steady-state sinusoids, there is no error in the result and any torque pulsations are correctly computed, even if the voltages are not balanced. Start-up transients and voltage harmonics will introduce an error into the torque calculation.

The invention has been described in connection with what is presently considered to be the preferred embodiment. The invention is not limited to this embodiment, but on the contrary, is intended to cover various modifications and equivalent arrangements included within the spirit and scope of the appended claims.

What is claimed is:

1. A motor monitoring system comprising:
   an on-site motor instrument unit having an on-site motor sensor for monitoring a motor, wherein the on-site sensor generates a signal representative of a first motor condition;
   an on-site motor computer unit electronically connectable to the on-site motor measurement unit, and processing the signal representative of the first motor condition;
   an off-site motor control center having a remote sensor for remotely monitoring a second motor condition, wherein the remote sensor generates a signal representative of a second motor condition;
   an off-site motor control center computer unit electronically connectable to the off-site motor control center and processing the signals representative of the second motor condition; and
   a communications link between the on-site motor computer unit and the off-site computer;
   wherein at least one of the on-site motor computer and the off-site motor control center computer synchronize information representative of the second motor condition with information representative of the first motor condition.

2. A motor monitoring system as in claim 1 wherein the second motor condition includes at least one condition from a group of conditions consisting of electrical power drawn by the motor, voltages drawn by the motor, currents drawn by the motor, and leakage current.

3. A motor monitoring system as in claim 1 wherein the communications link includes synchronization information to synchronize the information representing the first motor condition and the second motor condition.

4. A motor monitoring system as in claim 1 wherein the first motor condition includes at least one condition of a group of conditions consisting of motor speed, vibration, temperature, sound, radio frequency (RF) emissions, commutator profile, rotor position and magnetic stray flux.

5. A motor monitoring system comprising:
   an on-site motor instrument unit having an on-site motor sensor for monitoring a motor, wherein the on-site sensor generates a signal representative of a first motor condition;
   an on-site motor computer unit electronically connectable to the on-site motor measurement unit, and processing the signal representative of the first motor condition;
   an off-site motor control center having a remote sensor for remotely monitoring a second motor condition, wherein the remote sensor generates a signal representative of a second motor condition;
   an off-site motor control center computer unit electronically connectable to the off-site motor control center and processing the signals representative of the second motor condition;
   a communications link between the on-site motor computer unit and the off-site computer; and
   a third motor condition, which is monitored when the motor is off-line, and data regarding the third motor condition is stored a database.

6. A motor monitoring system comprising:
   an on-site motor instrument unit having an on-site motor sensor for monitoring a motor, wherein the on-site sensor generates a signal representative of a first motor condition;
   an on-site motor computer unit electronically connectable to the on-site motor measurement unit, and processing the signal representative of the first motor condition;
   an off-site motor control center having a remote sensor for remotely monitoring a second motor condition, wherein the remote sensor generates a signal representative of a second motor condition;
   an off-site motor control center computer unit electronically connectable to the off-site motor control center and processing the signals representative of the second motor condition; and
   a communications link between the on-site motor computer unit and the off-site computer, wherein the communications link is an Ethernet network in communication with the off-site motor control center computer unit and the on-site motor computer unit.

7. A motor monitoring system as in claim 1 wherein the second motor condition includes a waveform of current or voltage powering the motor.

8. A motor monitoring system as in claim 1 further comprising a database accessible to at least one of said on-site motor computer unit and said off-site motor control center computer unit having synchronized data representing the first motor condition and the second motor condition.

9. A method for monitoring a motor using an on-site motor instrument unit having an on-site motor sensor, an on-site motor computer unit electronically connectable to the on-site motor measurement unit, an off-site motor control center having an off-site sensor, an off-site motor control center computer unit electronically connectable to the off-site motor control center, and a communication link between the on-site motor computer unit and the off-site computer, wherein the method comprises the steps of:
   a. the on-site sensor monitoring a first motor condition at the motor and providing data on the first motor condition to the on-site motor computer unit;

b. the on-site sensor monitoring a second motor condition remotely from the motor and providing data on the second motor condition to the off-site motor control center computer unit;

c. transmitting the data on at least one of the first motor condition and the second motor condition to at least one of the on-site motor computer unit and the off-site motor control center computer unit;

d. synchronizing the data on the first motor condition with the data on the second motor condition.

10. A method for monitoring a motor as in claim 9 wherein in step (c) the data on the first motor condition and the second motor condition are exchanged over the communication link.

11. A method for monitoring a motor as in claim 9 further comprising the step of comparatively displaying the synchronized data on the first motor condition and on the second motor condition.

12. A method for monitoring a motor as in claim 11 wherein the synchronized data is displayed by at least one of the on-site motor computer unit and the off-site motor control computer unit.

13. A method for monitoring a motor as in claim 9 wherein the second condition is at least one condition from a group of conditions consisting of electrical power drawn by the motor, voltages drawn by the motor, currents drawn by the motor, and leakage current.

14. A method for monitoring a motor using an on-site motor instrument unit having an on-site motor sensor, an on-site motor computer unit electronically connectable to the on-site motor measurement unit, an off-site motor control center having an off-site sensor, an off-site motor control center computer unit electronically connectable to the off-site motor control center, and a communication link between the on-site motor computer unit and the off-site computer, wherein the method comprises the steps of:

a. the on-site sensor monitoring a first motor condition at the motor and providing data on the first motor condition to the on-site motor computer unit;

b. the on-site sensor monitoring a second motor condition remotely from the motor and providing data on the second motor condition to the off-site motor control center computer unit;

c. transmitting the data on at least one of the first motor condition and the second motor condition to at least one of the on-site motor computer unit and the off-site motor control center computer unit, wherein the data on the first motor condition and the second motor condition are captured in response to a predetermined external event;

d. synchronizing the data on the first motor condition with the data on the second motor condition.

15. A method for monitoring a motor as in claim 9 further comprising the steps of monitoring a third motor condition occurring when the motor is off-line and storing data regarding the first, second and third motor conditions in a database.

16. A motor monitoring system comprising:

a motor at a motor site;

an on-site motor measurement unit having an on-site motor sensors mounted proximate to the motor, wherein the on-site sensor generates a signal representative of a first motor condition;

an on-site motor computer unit electronically connected to the on-site motor measurement unit, and processing the signal generated by the on-site motor sensor, wherein the on-site motor computer unit stores data in a database representative of the signal generated by the on-site motor sensor;

an off-site motor control center having a remote sensor measuring motor performance from a location remote from the motor site, wherein the remote sensor generates a signal representative of a second motor condition;

an off-site motor control center computer unit electronically connected to the off-site motor control center and processing the signal representative of the second motor condition, wherein the off-site motor control center computer unit stores data in the database that is representative of the signals generated by the sensor at the off-site motor control center;

wherein the on-site motor computer unit and the off-site motor control center computer unit synchronize the signal representative of a second motor condition with the signal representative of the first motor condition.

17. A method for determining torque in a rotating electrical motor having a dynamic electrical sensor comprising the steps of:

a. sensing with the electrical sensor an alternating current waveform and an alternating voltage waveform being applied to drive the motor;

b. generating a voltage phasor based on a signal generated by the sensor in step (a);

c. determining a flux linkage phasor based on the voltage phasor and a frequency of the alternating voltage;

d. generating an alternating flux linkage waveform based on a flux linkage phasor generated in step (c);

e. determining dynamic torque from a cross-product of the alternating flux linkage waveform and alternating current waveform.

18. A method as in claim 17 further comprising determining the average torque from the dynamic torque.

* * * * *